(12) United States Patent
Price

(10) Patent No.: US 6,562,126 B2
(45) Date of Patent: May 13, 2003

(54) METHOD AND DEVICE FOR PRODUCING OPTICAL FLUORIDE CRYSTALS

(75) Inventor: Michael W. Price, Big Flats, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 09/976,602

(22) Filed: Oct. 11, 2001

(65) Prior Publication Data

US 2002/0066402 A1 Jun. 6, 2002

Related U.S. Application Data

(60) Provisional application No. 60/240,304, filed on Oct. 13, 2000.

(51) Int. Cl.[7] .................. C30B 11/00; C30B 17/00; C30B 21/02; C30B 28/06; C30B 9/00
(52) U.S. Cl. ............................. 117/81; 117/83
(58) Field of Search ..................... 117/81, 83

(56) References Cited

U.S. PATENT DOCUMENTS 6,320,700 B2    11/2001   Shiozawa .................. 359/642

FOREIGN PATENT DOCUMENTS

| FR | 2806743     | 9/2001  |           |
|----|-------------|---------|-----------|
| JP | 9-315893    | 5/1996  | C30B/29/12 |
| JP | 9-315815    | 12/1997 | C01F/11/22 |
| JP | 10-279378   | 10/1998 | C30B/29/12 |
| JP | 10-279396   | 10/1998 | C30B/29/12 |
| JP | 10-330192   | 12/1998 | C30B/29/12 |
| JP | 2001-192294 | 7/2001  | C30B/29/12 |

OTHER PUBLICATIONS

J. Jindra et al., The Production of Calcium Fluoride Monocrystals, 1968, Growth of Crystals, pp. 128–131.

C. William King et al., An Improved Window For Ring Imaging Cerenkov Detectors, IEEE Transactions of Nuclear Science, vol. 37, No. 2, Apr. 1990, pp. 65–67.

J. T. Mouchovski et al., Control of the Growth Optimum in Producing high–Quality CaF2 Crystals by an Improved Bridgman–Stockbarger Technique, Cryst. Res. Technol, 31 (1996) 6, pp. 727–737.

Crystal Growth by Monocomponent Liquid–Solid Equilibria, Ch. 5, Sec. 5.3 Bridgman–Stockbarger and Related Techniques.

Compensating for Linear Distortion Effects in X–Ray Lithography, IBM Technical Disclosure Bulletin, IBM Corp. NY USA, vol. 33, No. 6B, Nov. 1, 1990.

*Primary Examiner*—Felisa Hiteshew
(74) *Attorney, Agent, or Firm*—Adenike Adewuya; Edward F. Murphy

(57) ABSTRACT

A method for producing below 200 nm transmitting optical fluoride crystals includes loading a fluoride raw material into a vertical stack having at least 6 crystal growth chambers, heating the vertical stack to a temperature sufficient to maintain the fluoride raw material in a molten condition, applying a crystal growth thermal gradient to the vertical stack to form optical fluoride crystals within the molten fluoride raw material, and cooling the crystals.

24 Claims, 10 Drawing Sheets

METHOD AND DEVICE FOR PRODUCING OPTICAL FLUORIDE CRYSTALS

CROSS REFERENCE TO RELATED APPLICATIONS

This application claims priority from U.S. Provisional Application No. 60/240,304, entitled "Device/Method for Producing Optical Fluoride CaF$_2$ Crystals," filed Oct. 13, 2000.

BACKGROUND OF INVENTION

Optical fluoride crystals are useful materials because of their low-wavelength absorption edges. Optical fluoride crystals such as CaF$_2$, BaF$_2$, SrF$_2$, LiF, MgF$_2$, and NaF are useful in applications that require high transmission in the vacuum ultraviolet (VUV) region, i.e., at wavelengths below 200 nm. Optical fluoride crystals are particularly useful as below 200 nm transmitting optical element preforms for formation into optical elements with below 200 nm transmission, such as VUV microlithography optical elements (lens, prisims). Optical fluoride crystals are commonly directionally solidified by the Bridgman-Stockbarger technique. Other techniques for growing optical fluoride crystals include the Gradient Freeze technique and the Traveling Heater technique.

The Bridgman-Stockbarger technique is illustrated in FIGS. 1A and 1B. In FIG. 1A, a crucible C containing a fluoride raw material F is disposed inside a hot zone HZ of a vertical furnace 1. Heaters 2 are provided to heat the hot zone HZ to a temperature sufficient to melt the fluoride raw material F. After melting the fluoride raw material F, the crucible C is slowly lowered from the hot zone HZ to a cold zone CZ, as shown in FIG. 1B. The cold zone CZ is at a temperature lower than the melting point of the fluoride raw material F. As the crucible C passes from the hot zone HZ to the cold zone CZ, the molten material MF goes through a zone having a thermal gradient designed to grow a good crystal (crystal growth thermal gradient) On passing through this zone, the temperature transition inside the molten material MF creates a crystal front CF. The crystal growth front CF propagates inside the crucible C, within the molten material MF, as long as the crucible C is caused to move downwardly.

The Gradient Freeze technique is illustrated in FIGS. 2A and 2B. In FIG. 2A, a crucible C containing a fluoride raw material F is disposed inside a vertical furnace 3. The vertical furnace 3 is provided with two heaters 4 for creating an axial crystal growth thermal gradient within the crucible C. A single heater that is capable of creating a crystal growth thermal gradient across the axial axis of the crucible C may also be used. The vertical furnace 3 is heated to a temperature sufficient to melt the fluoride raw material F. After melting the fluoride raw material F, the power applied to the heaters 4 is decreased in a manner that allows a desired axial crystal growth thermal gradient within the crucible C to be sustained. As shown in FIG. 2B, as the power applied to the heaters 4 is decreased, the molten fluoride material MF is directionally solidified into a solid fluoride material SF.

The Traveling Heater method is illustrated in FIGS. 3A and 3B. In FIG. 3A, a crucible C containing a fluoride raw material F is disposed inside a vertical furnace 5. The furnace 5 includes three heaters 6 for creating a desired axial thermal profile within the furnace. Alternatively, two heaters capable of creating a desired axial thermal profile within the furnace may be used. The crucible C is initially located in the upper section of the vertical furnace 5 and heated to a temperature less than the melting point of the fluoride raw material F. As shown in FIG. 3B, the crucible C is then moved into the middle zone of the furnace 5 that is at a temperature above the melting point of the fluoride raw material. At this position, a portion of the fluoride raw material is melted. As the crucible C moves relative to the furnace, the molten raw material MF re-solidifies into "good" material SF. The melted raw material MF moves continually inside the crucible C until all the material inside the crucible C has been re-solidified.

Typically, crystals are produced one at a time in either a net size or a large size that is machined to a desired shape. In either case, productivity is low and production cost is high. The number of crystals produced per furnace run, which require minimal machining, can be increased by loading one or more stacks of crucibles within the furnace, where each crucible contains a fluoride raw material. Multiple crystals can then be produced per furnace run using any of the techniques described above. However, using vertically-stacked crucibles does not automatically improve productivity. Productivity can still be hampered by dead times for loading the furnace, evacuating the furnace, heating the different thermal zones of the furnace, cooling the different thermal zones of the furnace, and unloading the furnace. Also, production costs can prove prohibitive if too many crystals are grown in a single furnace run. Up till now, selection of the number of crystals to produce per furnace run has been arbitrary.

SUMMARY OF INVENTION

In one aspect, the invention relates to a method for producing optical fluoride crystals which comprises loading a fluoride raw material into a vertical stack having at least 6 crystal growth chambers, heating the vertical stack to a temperature sufficient to maintain the fluoride raw material in a molten condition, applying a crystal growth thermal gradient to the vertical stack to form crystals within the molten fluoride raw material, and cooling the crystals.

In another aspect, the invention relates to a method for producing optical fluoride crystals which comprises loading a fluoride raw material into multiple vertical stacks, wherein at least one vertical stack has at least 6 crystal growth chambers. The method further includes heating the vertical stacks to a temperature sufficient to maintain the fluoride raw material in a molten condition, applying a crystal growth thermal gradient to the vertical stacks to form crystals within the molten fluoride raw material, and cooling the crystals.

In another aspect, the invention relates to a device for growing optical fluoride crystals which comprises a furnace having a capacity to hold a vertical stack having at least 6 crystal growth chambers and at least one heating element to maintain an appropriate treatment temperature inside the furnace.

Other features and advantages of the invention will be apparent from the following description and the appended claims.

DETAILED DESCRIPTION

Figure 1B:
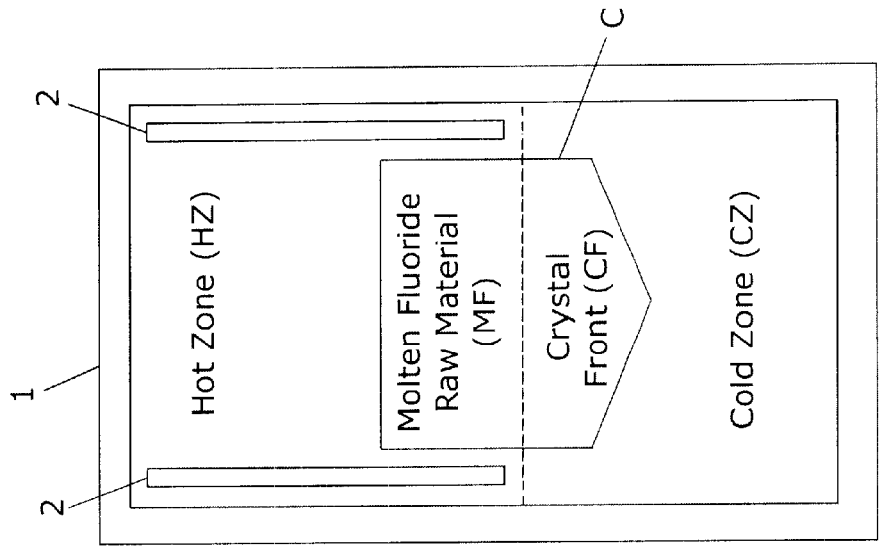
FIGS. 1A and 1B illustrate a process for forming a crystal using the Bridgman-Stockbarger technique.
Figure 1A:
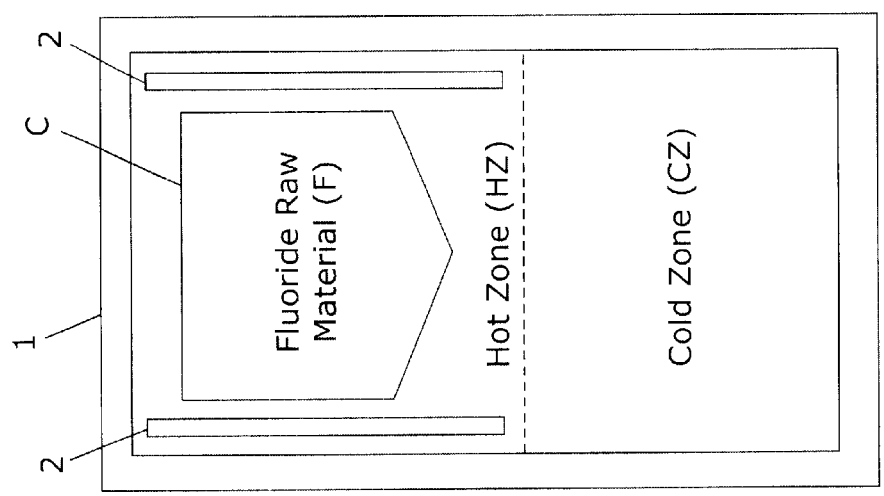
Figure 2B:
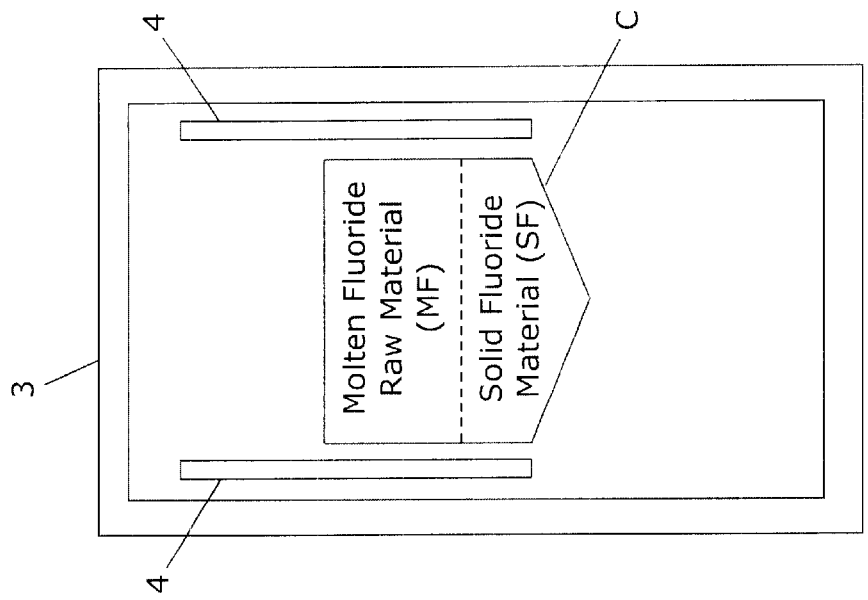
FIGS. 2A and 2B illustrate a process for forming a crystal using the Gradient Freeze technique.
Figure 2A:
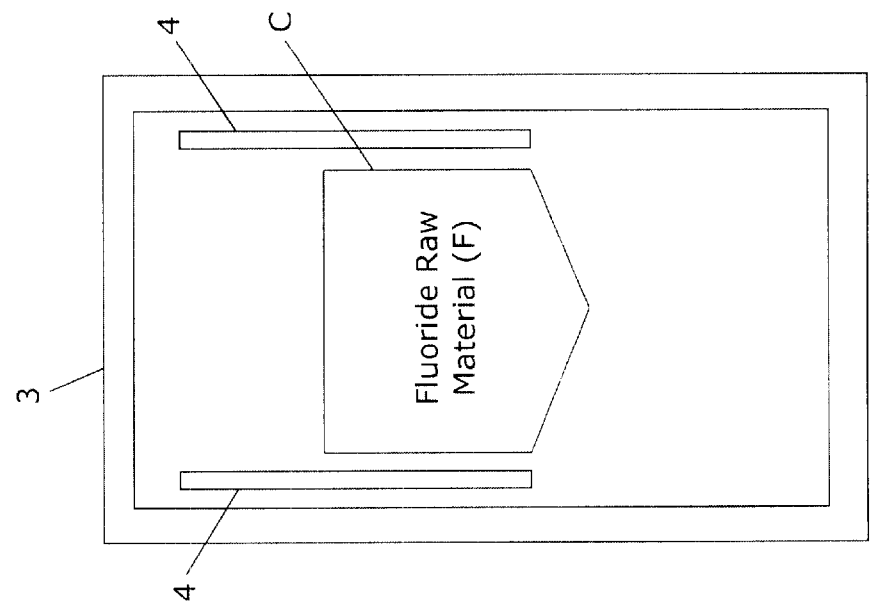
Figure 3B:
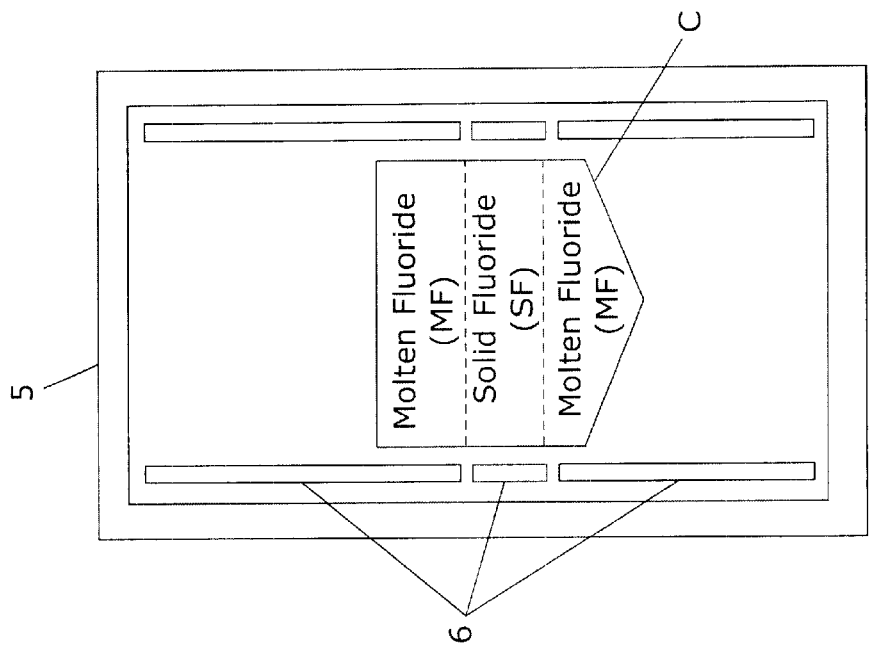
FIGS. 3A and 3B illustrates a process for forming a crystal using the Traveling Heater technique.
Figure 3A:
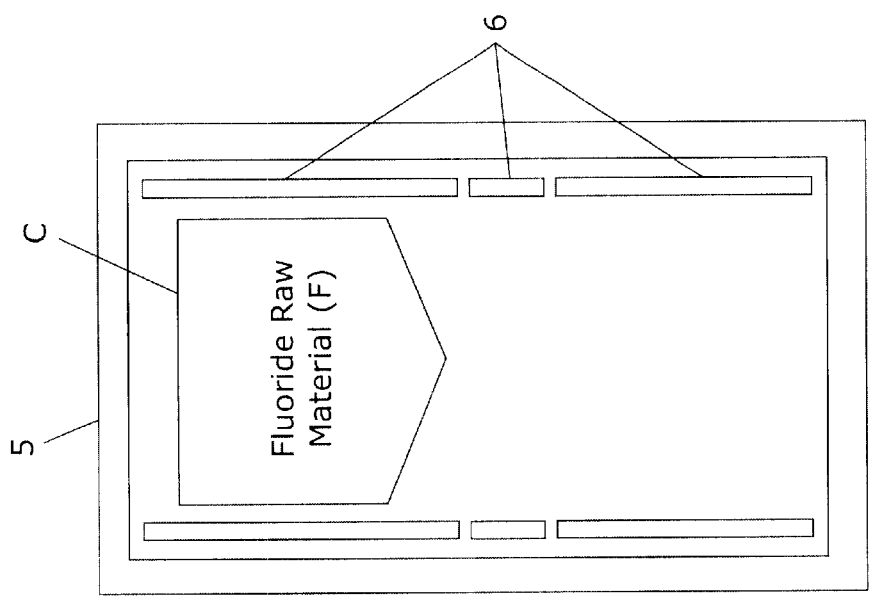

Embodiments of the invention provide a device and a method for producing crystals using one or more vertical stacks of crystal growth chambers. Specific embodiments of the invention are described below. In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

The underlying driver in the production of crystals is how fast the crystals can be delivered to the customer. If multiple crystals can be produced in a single furnace run, then it would be possible to deliver more crystals to the customer within a given time frame. Of course, the crystals have to be good crystals. A "good crystal" may be defined as one that meets the specifications of the target application. As an example, a fluoride crystal for use in microlithography applications may be required to meet the following specifications: (1) greater than 40% of the volume of the crystal should consist of one grain of the fluoride material, (2) the refractive index of the crystal should not vary by more than 4 ppm across a flat surface of the crystal when measured using a 632-nm laser, (3) the average birefringence of the crystal should be less than 4 nm/cm when measured using a 632-nm laser, (4) the initial internal transmission of the crystal should be greater than 99.0% at wavelengths greater than 155 nm and greater than 75.0% at wavelengths between 135 nm and 155 nm, and (5) the crystal should have a diameter in a range from 40 to 400 mm and a thickness in a range from 10 to 300 mm.

In the invention, multiple crystals are grown in vertically stacked crucibles or crystal growth chambers. The process of growing multiple crystals can be divided into a solidification segment and an annealing segment. During solidification, molten raw material is translated through a crystal growth thermal gradient to form a crystal. The solidification time is a function of the stack height and the rate at which the stack is translated. The solidification time is given by the following expression:

$$t_s = \frac{nh}{v} \quad (1)$$

where $t_s$ is the solidification time, n is the number of crucibles in the stack, h is the height of each crucible in the stack, and v is the translation rate of the stack. The annealing step involves slowly cooling the crystals in the stack and is assumed to be independent of the stack height. The total time for a single furnace run can then be estimated as follows:

$$T = t_s + t_a \quad (2)$$

where T is the total time for a furnace run, $t_s$ is the solidification time from equation (1) above, and $t_a$ is the annealing time.

Table 1 shows the number of days required to run a single furnace as a function of the number of crystals produced by the furnace in a single run. Table 1 also shows the number of furnace runs and the total number of crystals that can be made in a year. The data shown in Table 1 is based on the following assumptions: (1) each new crystal adds 100 mm to the height of the stack, (2) the translation rate of the stack is 2.5 mm/hr, and (3) the annealing time is 17 days. It should be noted that these assumptions are presented for illustration purposes only and are not intended to limit the invention. For example, the thickness of the crystals may be in a range from 10 to 300 mm, the translation rate may be in a range from 0.5 mm/hr to 5 mm/hr, and the annealing time may be in a range from 2 to 30 days. The trends shown in Table 1 and in other tables and figures that will be discussed below hold true for these ranges.

Table 1 shows that the number of days required to run a furnace increases as the number of crystals produced in a single run of the furnace increases. Table 1 also shows that the total number of crystals that can be produced in a single year increases as the number of crystals produced per furnace run increases.

TABLE 1

Crystal Production Data For a One-Year Period

| Stack Size | No. of Days per Furnace Run | No. of Runs per Year | No. of Crystals per Year |
| --- | --- | --- | --- |
| 2 | 20.3 | 18.0 | 35.9 |
| 3 | 22.0 | 16.6 | 49.8 |
| 4 | 23.7 | 15.4 | 61.7 |
| 5 | 25.3 | 14.4 | 72.0 |
| 6 | 27.0 | 13.5 | 81.1 |
| 7 | 28.7 | 12.7 | 89.1 |
| 8 | 30.3 | 12.0 | 96.3 |
| 9 | 32.0 | 11.4 | 102.7 |
| 10 | 33.7 | 10.8 | 108.4 |
| 11 | 35.3 | 10.3 | 113.6 |
| 12 | 37.0 | 9.9 | 118.4 |
| 13 | 38.7 | 9.4 | 122.7 |
| 14 | 40.3 | 9.0 | 126.7 |
| 15 | 42.0 | 8.7 | 130.4 |
| 16 | 43.7 | 8.4 | 133.7 |
| 17 | 45.3 | 8.1 | 136.9 |
| 18 | 47.0 | 7.8 | 139.8 |
| 19 | 48.7 | 7.5 | 142.5 |
| 20 | 50.3 | 7.3 | 145.0 |
| 21 | 52.0 | 7.0 | 147.4 |
| 22 | 53.7 | 6.8 | 149.6 |
| 23 | 55.3 | 6.6 | 151.7 |
| 24 | 57.0 | 6.4 | 153.7 |
| 25 | 58.7 | 6.2 | 155.5 |
| 26 | 60.3 | 6.0 | 157.3 |
| 27 | 62.0 | 5.9 | 159.0 |
| 28 | 63.7 | 5.7 | 160.5 |
| 29 | 65.3 | 5.6 | 162.0 |
| 30 | 67.0 | 5.4 | 163.4 |
| 31 | 68.7 | 5.3 | 164.8 |
| 32 | 70.3 | 5.2 | 166.1 |
| 33 | 72.0 | 5.1 | 167.3 |
| 34 | 73.7 | 5.0 | 168.5 |
| 35 | 75.3 | 4.8 | 169.6 |
| 36 | 77.0 | 4.7 | 170.6 |
| 37 | 78.7 | 4.6 | 171.7 |
| 38 | 80.3 | 4.5 | 172.7 |
| 39 | 82.0 | 4.5 | 173.6 |
| 40 | 83.7 | 4.4 | 174.5 |
| 41 | 85.3 | 4.3 | 175.4 |
| 42 | 87.0 | 4.2 | 176.2 |
| 43 | 88.7 | 4.1 | 177.0 |
| 44 | 90.3 | 4.0 | 177.8 |
| 45 | 92.0 | 4.0 | 178.5 |

The data shown in Table 1 does not account for downtime. Table 2 shows the data of Table 1 adjusted for downtime.

The assumptions made in Table 2 are that there are 2 idle days between furnace runs and that every seventh furnace run is aborted because of furnace failure. Thus, the data in Table 2 gives a more conservative estimate of the number of furnace runs that can be made per year and the number of crystals that can be produced per year.

TABLE 2

Crystal Production Data For a One-Year Period Including Downtime

| Stack Size | No. of Operating Days per Year | No. of Runs per Year | No. of Crystals per Year |
|---|---|---|---|
| 2 | 279.0 | 13.7 | 27.4 |
| 3 | 281.7 | 12.8 | 38.4 |
| 4 | 284.0 | 12.0 | 48.0 |
| 5 | 286.0 | 11.3 | 56.5 |
| 6 | 287.8 | 10.7 | 64.0 |
| 7 | 289.4 | 10.1 | 70.7 |
| 8 | 290.8 | 9.6 | 76.7 |
| 9 | 292.0 | 9.1 | 82.1 |
| 10 | 293.2 | 8.7 | 87.1 |
| 11 | 294.2 | 8.3 | 91.6 |
| 12 | 295.1 | 8.0 | 95.7 |
| 13 | 296.0 | 7.7 | 99.5 |
| 14 | 296.8 | 7.4 | 103.0 |
| 15 | 297.5 | 7.1 | 106.2 |
| 16 | 298.1 | 6.8 | 109.2 |
| 17 | 298.8 | 6.6 | 112.0 |
| 18 | 299.3 | 6.4 | 114.6 |
| 19 | 299.9 | 6.2 | 117.1 |
| 20 | 300.4 | 6.0 | 119.3 |
| 21 | 300.8 | 5.8 | 121.5 |
| 22 | 301.3 | 5.6 | 123.5 |
| 23 | 301.7 | 5.5 | 125.4 |
| 24 | 302.1 | 5.3 | 127.2 |
| 25 | 302.4 | 5.2 | 128.9 |
| 26 | 302.8 | 5.0 | 130.5 |
| 27 | 303.1 | 4.9 | 132.0 |
| 28 | 303.4 | 4.8 | 133.4 |
| 29 | 303.7 | 4.6 | 134.8 |
| 30 | 304.0 | 4.5 | 136.1 |
| 31 | 304.2 | 4.4 | 137.3 |
| 32 | 304.5 | 4.3 | 138.5 |
| 33 | 304.7 | 4.2 | 139.7 |
| 34 | 304.9 | 4.1 | 140.7 |
| 35 | 305.2 | 4.1 | 141.8 |
| 36 | 305.4 | 4.0 | 142.8 |
| 37 | 305.6 | 3.9 | 143.7 |
| 38 | 305.8 | 3.8 | 144.6 |
| 39 | 306.0 | 3.7 | 145.5 |
| 40 | 306.1 | 3.7 | 146.4 |
| 41 | 306.3 | 3.6 | 147.2 |
| 42 | 306.5 | 3.5 | 147.9 |
| 43 | 306.6 | 3.5 | 148.7 |
| 44 | 306.8 | 3.4 | 149.4 |
| 45 | 306.9 | 3.3 | 150.1 |

Figure 4:
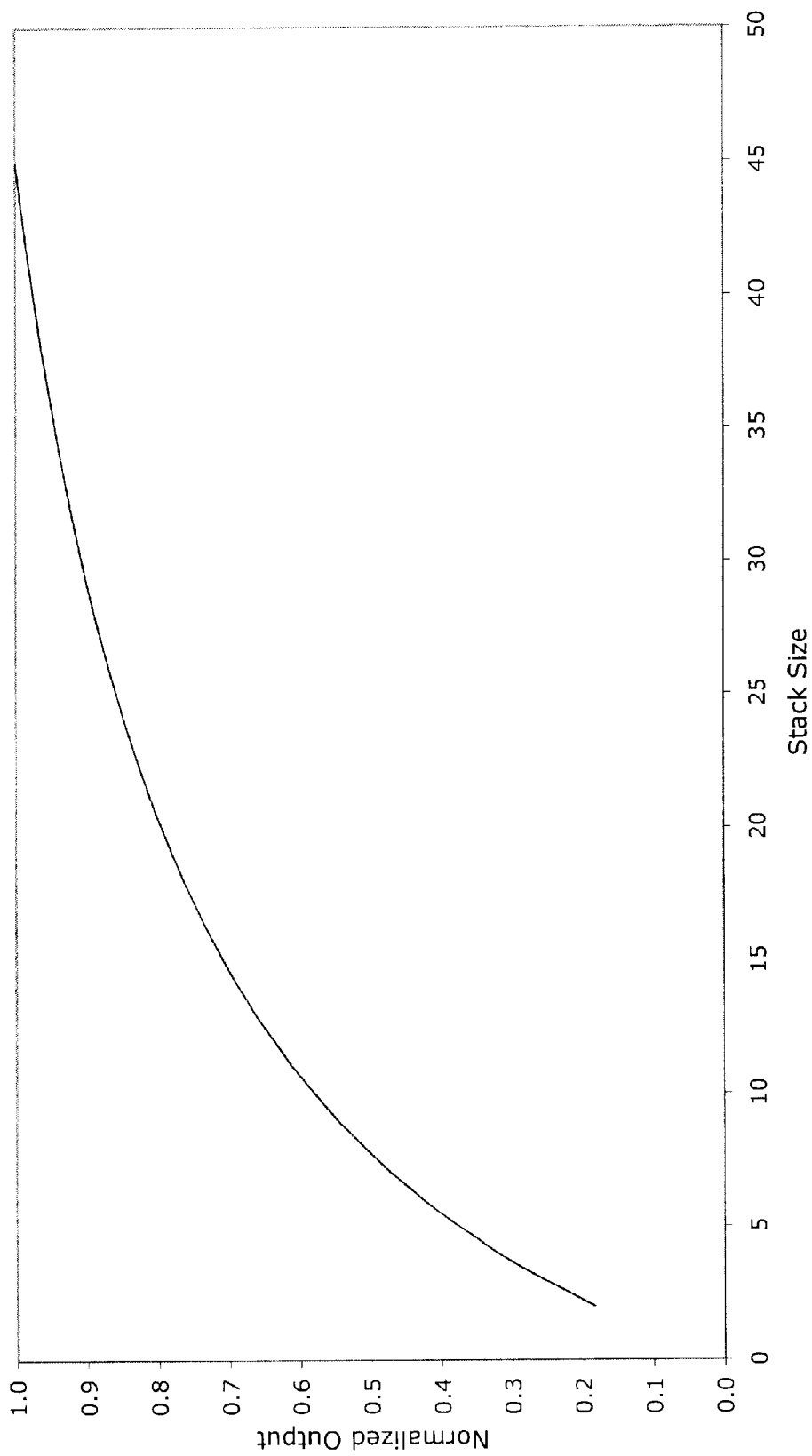
FIG. 4 shows a plot of normalized output as a function of stack size.

Table 3 expands the data of Table 2 to a five year period. Specifically, Table 3 shows the number of operating days, the number of furnace runs in 5 years, and the number of crystals produced in 5 years for stack size ranging from 2 to 45. Table 3 also shows normalized outputs, where the normalized outputs are obtained by dividing the number of crystals produced within the 5-year period for each stack size by the number of crystals produced within the 5-year period for a stack size of 45. FIG. 4 shows a plot of normalized output as a function of stack size. If normalized output is used as an indicator of production efficiency, then FIG. 4 shows that production efficiency increases as the stack size increases.

Figure 5:
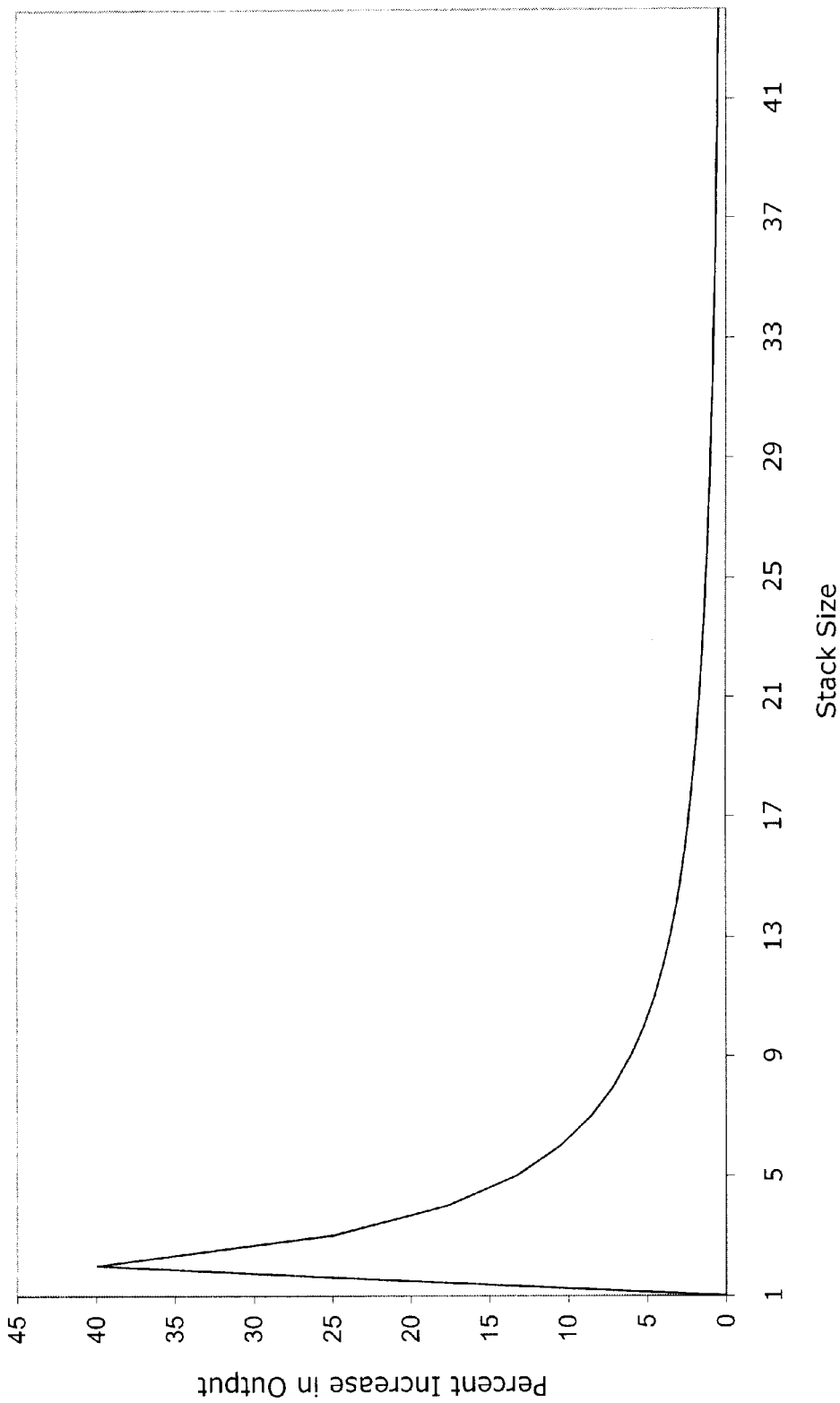
FIG. 5 shows a plot of percent increase in output as a function of stack size.

Also shown in Table 3 is the percent increase in output as the number of crystals produced in a single furnace increases. FIG. 5 shows percent increase in output plotted as a function of stack size. As can be observed from the figure, output increases as stack size increases, but at a diminishing rate. The greatest gain in output occurs in going from 2 crystals per furnace run to 3 crystals per furnace run. Increase in output rapidly diminishes from 40% to 13.3% as stack size increases from 3 to 6. Increase in output continues to diminish, but at a slower rate, from 13.3% to 1.9% as stack size increases from 6 to 20. Beyond a stack size of 20, the increase in output is fairly constant and less than 1.9%.

TABLE 3

Crystal Production Data for Five-Year Period Including Downtime

| Stack Size | No. of Operating Days in 5 Years | No. of Furnace Runs in 5 Years | No. of Crystals in 5 Years | Normalized Output | Percent Increase in Output |
|---|---|---|---|---|---|
| 2 | 1394.8 | 68.6 | 137.2 | 0.2 | 0.0 |
| 3 | 1408.4 | 64.0 | 192.1 | 0.3 | 40.0 |
| 4 | 1420.1 | 60.0 | 240.0 | 0.3 | 25.0 |
| 5 | 1430.2 | 56.5 | 282.3 | 0.4 | 17.6 |
| 6 | 1439.1 | 53.3 | 319.8 | 0.4 | 13.3 |
| 7 | 1447.0 | 50.5 | 353.3 | 0.5 | 10.5 |
| 8 | 1454.0 | 47.9 | 383.5 | 0.5 | 8.5 |
| 9 | 1460.2 | 45.6 | 410.7 | 0.5 | 7.1 |
| 10 | 1465.9 | 43.5 | 435.4 | 0.6 | 6.0 |
| 11 | 1471.0 | 41.6 | 457.9 | 0.6 | 5.2 |
| 12 | 1475.6 | 39.9 | 478.6 | 0.6 | 4.5 |
| 13 | 1479.9 | 38.3 | 497.5 | 0.7 | 4.0 |
| 14 | 1483.8 | 36.8 | 515.0 | 0.7 | 3.5 |
| 15 | 1487.4 | 35.4 | 531.2 | 0.7 | 3.1 |
| 16 | 1490.7 | 34.1 | 546.2 | 0.7 | 2.8 |
| 17 | 1493.8 | 33.0 | 560.2 | 0.7 | 2.6 |
| 18 | 1496.6 | 31.8 | 573.2 | 0.8 | 2.3 |
| 19 | 1499.3 | 30.8 | 585.3 | 0.8 | 2.1 |
| 20 | 1501.8 | 29.8 | 596.7 | 0.8 | 1.9 |
| 21 | 1504.1 | 28.9 | 607.4 | 0.8 | 1.8 |

TABLE 3-continued

Crystal Production Data for Five-Year Period Including Downtime

| Stack Size | No. of Operating Days in 5 Years | No. of Furnace Runs in 5 Years | No. of Crystals in 5 Years | Normalized Output | Percent Increase in Output |
|---|---|---|---|---|---|
| 22 | 1506.3 | 28.1 | 617.5 | 0.8 | 1.7 |
| 23 | 1508.3 | 27.3 | 627.0 | 0.8 | 1.5 |
| 24 | 1510.3 | 26.5 | 635.9 | 0.8 | 1.4 |
| 25 | 1512.1 | 25.8 | 644.3 | 0.9 | 1.3 |
| 26 | 1513.8 | 25.1 | 652.4 | 0.9 | 1.2 |
| 27 | 1515.4 | 24.4 | 659.9 | 0.9 | 1.2 |
| 28 | 1517.0 | 23.8 | 667.1 | 0.9 | 1.1 |
| 29 | 1518.4 | 23.2 | 674.0 | 0.9 | 1.0 |
| 30 | 1519.8 | 22.7 | 680.5 | 0.9 | 1.0 |
| 31 | 1521.1 | 22.2 | 686.7 | 0.9 | 0.9 |
| 32 | 1522.4 | 21.6 | 692.7 | 0.9 | 0.9 |
| 33 | 1523.6 | 21.2 | 698.3 | 0.9 | 0.8 |
| 34 | 1524.7 | 20.7 | 703.7 | 0.9 | 0.8 |
| 35 | 1525.8 | 20.3 | 708.9 | 0.9 | 0.7 |
| 36 | 1526.9 | 19.8 | 713.9 | 1.0 | 0.7 |
| 37 | 1527.9 | 19.4 | 718.6 | 1.0 | 0.7 |
| 38 | 1528.9 | 19.0 | 723.2 | 1.0 | 0.6 |
| 39 | 1529.8 | 18.7 | 727.6 | 1.0 | 0.6 |
| 40 | 1530.7 | 18.3 | 731.8 | 1.0 | 0.6 |
| 41 | 1531.5 | 17.9 | 735.8 | 1.0 | 0.6 |
| 42 | 1532.3 | 17.6 | 739.7 | 1.0 | 0.5 |
| 43 | 1533.1 | 17.3 | 743.5 | 1.0 | 0.5 |
| 44 | 1533.9 | 17.0 | 747.1 | 1.0 | 0.5 |
| 45 | 1534.6 | 16.7 | 750.6 | 1.0 | 0.5 |

Another factor to consider in production of crystals is cost. The initial capital investment for the furnaces and the cost of running the furnaces determine the cost of the crystals and whether it is economically feasible to produce a certain number of crystals in a single furnace run. In general, the number of furnaces required to produced a certain number of good crystals decreases as the stack size increases and depends on the yield of the furnace. Table 4 shows the number of good crystals produced per furnace over a 5 year period for various anticipated yield values.

TABLE 4

Number of Good Crystals Produced Over a Five-Year Period for Various Anticipated Yield Values

| Stack Size | 1% | 5% | 10% | 20% | 50% | 80% |
|---|---|---|---|---|---|---|
| 2 | 1 | 6 | 13 | 27 | 68 | 109 |
| 3 | 1 | 9 | 19 | 38 | 96 | 153 |
| 4 | 2 | 12 | 24 | 48 | 120 | 192 |
| 5 | 2 | 14 | 28 | 56 | 141 | 225 |
| 6 | 3 | 15 | 31 | 63 | 159 | 255 |
| 7 | 3 | 17 | 35 | 70 | 176 | 282 |
| 8 | 3 | 19 | 38 | 76 | 191 | 306 |
| 9 | 4 | 20 | 41 | 82 | 205 | 328 |
| 10 | 4 | 21 | 43 | 87 | 217 | 348 |
| 11 | 4 | 22 | 45 | 91 | 228 | 366 |
| 12 | 4 | 23 | 47 | 95 | 239 | 382 |
| 13 | 4 | 24 | 49 | 99 | 248 | 398 |
| 14 | 5 | 25 | 51 | 103 | 257 | 412 |
| 15 | 5 | 26 | 53 | 106 | 265 | 424 |
| 16 | 5 | 27 | 54 | 109 | 273 | 436 |
| 17 | 5 | 28 | 56 | 112 | 280 | 448 |
| 18 | 5 | 28 | 57 | 114 | 286 | 458 |
| 19 | 5 | 29 | 58 | 117 | 292 | 468 |
| 20 | 5 | 29 | 59 | 119 | 298 | 477 |
| 21 | 6 | 30 | 60 | 121 | 303 | 485 |
| 22 | 6 | 30 | 61 | 123 | 308 | 493 |
| 23 | 6 | 31 | 62 | 125 | 313 | 501 |
| 24 | 6 | 31 | 63 | 127 | 317 | 508 |
| 25 | 6 | 32 | 64 | 128 | 322 | 515 |
| 26 | 6 | 32 | 65 | 130 | 326 | 521 |

TABLE 4-continued

Number of Good Crystals Produced Over a Five-Year Period for Various Anticipated Yield Values

| Stack Size | 1% | 5% | 10% | 20% | 50% | 80% |
|---|---|---|---|---|---|---|
| 27 | 6 | 32 | 65 | 131 | 329 | 527 |
| 28 | 6 | 33 | 66 | 133 | 333 | 533 |
| 29 | 6 | 33 | 67 | 134 | 336 | 539 |
| 30 | 6 | 34 | 68 | 136 | 340 | 544 |
| 31 | 6 | 34 | 68 | 137 | 343 | 549 |
| 32 | 6 | 34 | 69 | 138 | 346 | 554 |
| 33 | 6 | 34 | 69 | 139 | 349 | 558 |
| 34 | 7 | 35 | 70 | 140 | 351 | 562 |
| 35 | 7 | 35 | 70 | 141 | 354 | 567 |
| 36 | 7 | 35 | 71 | 142 | 356 | 571 |
| 37 | 7 | 35 | 71 | 143 | 359 | 574 |
| 38 | 7 | 36 | 72 | 144 | 361 | 578 |
| 39 | 7 | 36 | 72 | 145 | 363 | 582 |
| 40 | 7 | 36 | 73 | 146 | 365 | 585 |
| 41 | 7 | 36 | 73 | 147 | 367 | 588 |
| 42 | 7 | 36 | 73 | 147 | 369 | 591 |
| 43 | 7 | 37 | 74 | 148 | 371 | 594 |
| 44 | 7 | 37 | 74 | 149 | 373 | 597 |
| 45 | 7 | 37 | 75 | 150 | 375 | 600 |

Table 5 shows the number of furnaces required to produce 300 good crystals over a 5 year period for various anticipated yield values. The data shows that the number of furnaces required to produce the crystals decreases as the stack size increases.

TABLE 5

Number of Furnaces Required to Produce 300 Good Crystals for Various Anticipated Yield Values

| Stack Size | 1% | 5% | 10% | 20% | 50% | 80% |
|---|---|---|---|---|---|---|
| 2 | 300 | 50 | 23 | 11 | 4 | 3 |
| 3 | 300 | 33 | 16 | 8 | 3 | 2 |

TABLE 5-continued

Number of Furnaces Required to Produce 300 Good Crystals for Various Anticipated Yield Values

| Stack Size | 1% | 5% | 10% | 20% | 50% | 80% |
|---|---|---|---|---|---|---|
| 4 | 150 | 25 | 13 | 6 | 3 | 2 |
| 5 | 150 | 21 | 11 | 5 | 2 | 1 |
| 6 | 100 | 20 | 10 | 5 | 2 | 1 |
| 7 | 100 | 18 | 9 | 4 | 2 | 1 |
| 8 | 100 | 16 | 8 | 4 | 2 | 1 |
| 9 | 75 | 15 | 7 | 4 | 1 | 1 |
| 10 | 75 | 14 | 7 | 3 | 1 | 1 |
| 11 | 75 | 14 | 7 | 3 | 1 | 1 |
| 12 | 75 | 13 | 6 | 3 | 1 | 1 |
| 13 | 75 | 13 | 6 | 3 | 1 | 1 |
| 14 | 60 | 12 | 6 | 3 | 1 | 1 |
| 15 | 60 | 12 | 6 | 3 | 1 | 1 |
| 16 | 60 | 11 | 6 | 3 | 1 | 1 |
| 17 | 60 | 11 | 5 | 3 | 1 | 1 |
| 18 | 60 | 11 | 5 | 3 | 1 | 1 |
| 19 | 60 | 10 | 5 | 3 | 1 | 1 |
| 20 | 60 | 10 | 5 | 3 | 1 | 1 |
| 21 | 50 | 10 | 5 | 2 | 1 | 1 |
| 22 | 50 | 10 | 5 | 2 | 1 | 1 |
| 23 | 50 | 10 | 5 | 2 | 1 | 1 |
| 24 | 50 | 10 | 5 | 2 | 1 | 1 |
| 25 | 50 | 9 | 5 | 2 | 1 | 1 |
| 26 | 50 | 9 | 5 | 2 | 1 | 1 |
| 27 | 50 | 9 | 5 | 2 | 1 | 1 |
| 28 | 50 | 9 | 5 | 2 | 1 | 1 |
| 29 | 50 | 9 | 4 | 2 | 1 | 1 |
| 30 | 50 | 9 | 4 | 2 | 1 | 1 |
| 31 | 50 | 9 | 4 | 2 | 1 | 1 |
| 32 | 50 | 9 | 4 | 2 | 1 | 1 |
| 33 | 50 | 9 | 4 | 2 | 1 | 1 |
| 34 | 43 | 9 | 4 | 2 | 1 | 1 |
| 35 | 43 | 9 | 4 | 2 | 1 | 1 |
| 36 | 43 | 9 | 4 | 2 | 1 | 1 |
| 37 | 43 | 9 | 4 | 2 | 1 | 1 |
| 38 | 43 | 8 | 4 | 2 | 1 | 1 |
| 39 | 43 | 8 | 4 | 2 | 1 | 1 |
| 40 | 43 | 8 | 4 | 2 | 1 | 1 |
| 41 | 43 | 8 | 4 | 2 | 1 | 1 |
| 42 | 43 | 8 | 4 | 2 | 1 | 1 |
| 43 | 43 | 8 | 4 | 2 | 1 | 1 |
| 44 | 43 | 8 | 4 | 2 | 1 | 1 |
| 45 | 43 | 8 | 4 | 2 | 1 | 1 |

Figure 6:
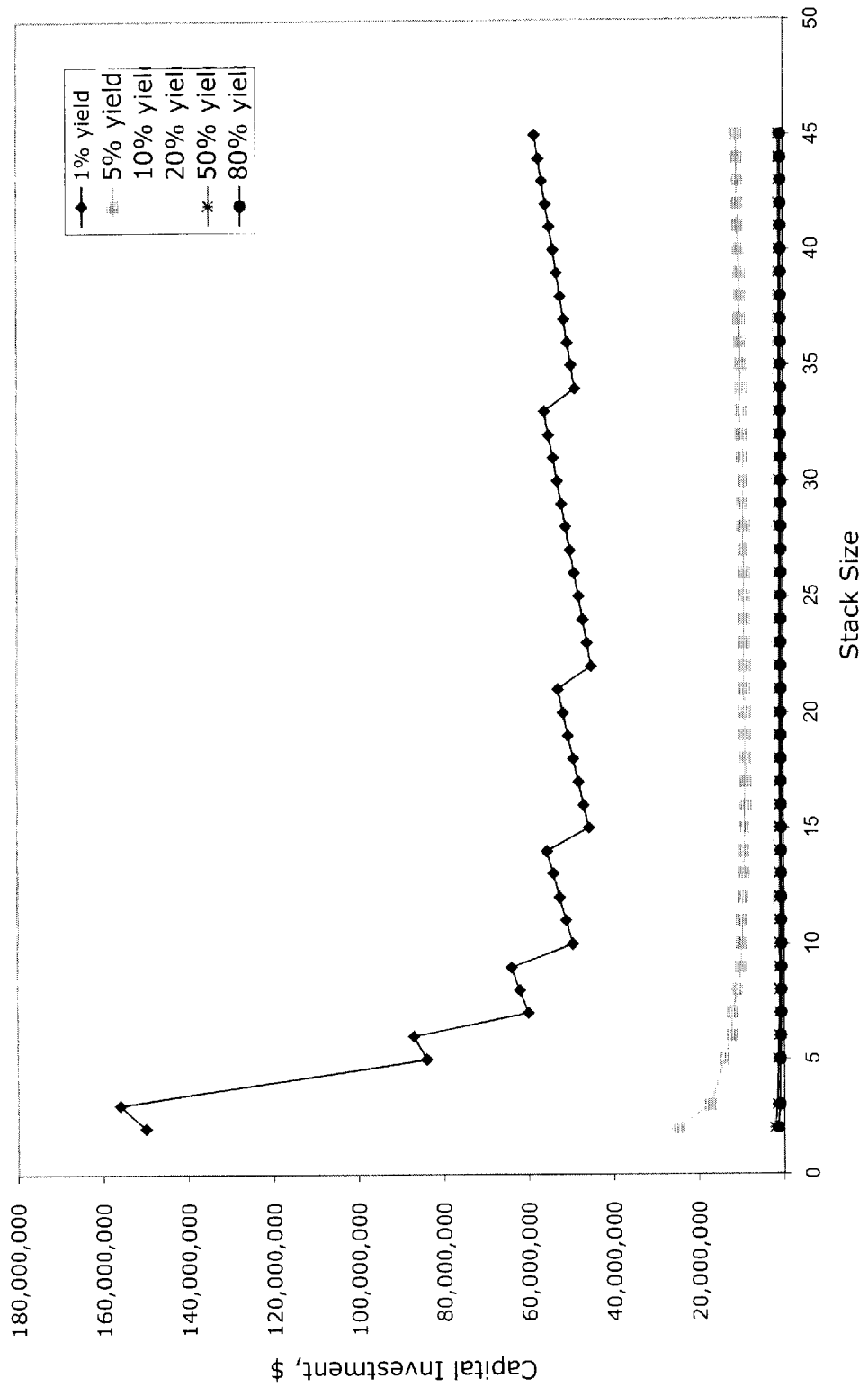
FIG. 6 shows a plot of capital investment as a function of stack size for various anticipated yields.

Table 6 shows estimated capital costs in dollars for furnaces based on production of 300 good crystals for different stack sizes and anticipated yield values of the furnaces. The data in Table 6 is based on the assumptions that the base cost of a furnace that produces two crystals in a single furnace run is $500,000 and that each additional crystal produced by the furnace in a single furnace run will increase the cost of the furnace by $20,000. In general, the base cost of the furnace may range from $200,000 to $1,000,000 and each additional crystal may increase the cost of the furnace by $5,000 to $50,000. The trends shown in Table 6 hold true regardless of the actual dollar estimates used for the furnaces. FIG. 6 shows capital investment as a function of stack size for various anticipated yields. As shown in FIG. 6, capital investment cost initially decreases as the stack size increases and then starts to increase again around a stack size of 26.

TABLE 6

Furnace Cost Based on Production of 300 Good Crystals for Various Anticipated Yield Values

| Stack Size | 1% | 5% | 10% | 20% | 50% | 80% |
|---|---|---|---|---|---|---|
| 2 | 150,000,000 | 25,000,000 | 11,538,462 | 5,555,556 | 2,205,882 | 1,376,147 |
| 3 | 156,000,000 | 17,333,333 | 8,210,526 | 4,105,263 | 1,625,000 | 1,019,608 |
| 4 | 84,000,000 | 14,000,000 | 7,000,000 | 3,500,000 | 1,400,000 | 875,000 |
| 5 | 87,000,000 | 12,428,571 | 6,214,286 | 3,107,143 | 1,234,043 | 773,333 |
| 6 | 60,000,000 | 12,000,000 | 5,806,452 | 2,857,143 | 1,132,075 | 705,882 |
| 7 | 62,000,000 | 10,941,176 | 5,314,286 | 2,657,143 | 1,056,818 | 659,574 |
| 8 | 64,000,000 | 10,105,263 | 5,052,632 | 2,526,316 | 1,005,236 | 627,451 |
| 9 | 49,500,000 | 9,900,000 | 4,829,268 | 2,414,634 | 965,854 | 603,659 |
| 10 | 51,000,000 | 9,714,286 | 4,744,186 | 2,344,828 | 940,092 | 586,207 |
| 11 | 52,500,000 | 9,545,455 | 4,666,667 | 2,307,692 | 921,053 | 573,770 |
| 12 | 54,000,000 | 9,391,304 | 4,595,745 | 2,273,684 | 903,766 | 565,445 |
| 13 | 55,500,000 | 9,250,000 | 4,530,612 | 2,242,424 | 895,161 | 557,789 |
| 14 | 45,600,000 | 9,120,000 | 4,470,588 | 2,213,592 | 887,160 | 553,398 |
| 15 | 46,800,000 | 9,000,000 | 4,415,094 | 2,207,547 | 883,019 | 551,887 |
| 16 | 48,000,000 | 8,888,889 | 4,444,444 | 2,201,835 | 879,121 | 550,459 |
| 17 | 49,200,000 | 8,785,714 | 4,392,857 | 2,196,429 | 878,571 | 549,107 |
| 18 | 50,400,000 | 9,000,000 | 4,421,053 | 2,210,526 | 881,119 | 550,218 |
| 19 | 51,600,000 | 8,896,552 | 4,448,276 | 2,205,128 | 883,562 | 551,282 |
| 20 | 52,800,000 | 9,103,448 | 4,474,576 | 2,218,487 | 885,906 | 553,459 |
| 21 | 45,000,000 | 9,000,000 | 4,500,000 | 2,231,405 | 891,089 | 556,701 |
| 22 | 46,000,000 | 9,200,000 | 4,524,590 | 2,243,902 | 896,104 | 559,838 |
| 23 | 47,000,000 | 9,096,774 | 4,548,387 | 2,256,000 | 900,958 | 562,874 |
| 24 | 48,000,000 | 9,290,323 | 4,571,429 | 2,267,717 | 908,517 | 566,929 |
| 25 | 49,000,000 | 9,187,500 | 4,593,750 | 2,296,875 | 913,043 | 570,874 |
| 26 | 50,000,000 | 9,375,000 | 4,615,385 | 2,307,692 | 920,245 | 575,816 |
| 27 | 51,000,000 | 9,562,500 | 4,707,692 | 2,335,878 | 930,091 | 580,645 |
| 28 | 51,000,000 | 9,272,727 | 4,636,364 | 2,300,752 | 918,919 | 574,109 |
| 29 | 52,000,000 | 9,454,545 | 4,656,716 | 2,328,358 | 928,571 | 578,850 |
| 30 | 53,000,000 | 9,352,941 | 4,676,471 | 2,338,235 | 935,294 | 584,559 |
| 31 | 54,000,000 | 9,529,412 | 4,764,706 | 2,364,964 | 944,606 | 590,164 |

TABLE 6-continued

Furnace Cost Based on Production of 300 Good Crystals for Various Anticipated Yield Values

| Stack Size | 1% | 5% | 10% | 20% | 50% | 80% |
|---|---|---|---|---|---|---|
| 32 | 55,000,000 | 9,705,882 | 4,782,609 | 2,391,304 | 953,757 | 595,668 |
| 33 | 56,000,000 | 9,882,353 | 4,869,565 | 2,417,266 | 962,751 | 602,151 |
| 34 | 48,857,143 | 9,771,429 | 4,885,714 | 2,442,857 | 974,359 | 608,541 |
| 35 | 49,714,286 | 9,942,857 | 4,971,429 | 2,468,085 | 983,051 | 613,757 |
| 36 | 50,571,429 | 10,114,286 | 4,985,915 | 2,492,958 | 994,382 | 619,965 |
| 37 | 51,428,571 | 10,285,714 | 5,070,423 | 2,517,483 | 1,002,786 | 627,178 |
| 38 | 52,285,714 | 10,166,667 | 5,083,333 | 2,541,667 | 1,013,850 | 633,218 |
| 39 | 53,142,857 | 10,333,333 | 5,166,667 | 2,565,517 | 1,024,793 | 639,175 |
| 40 | 54,000,000 | 10,500,000 | 5,178,082 | 2,589,041 | 1,035,616 | 646,154 |
| 41 | 54,857,143 | 10,666,667 | 5,260,274 | 2,612,245 | 1,046,322 | 653,061 |
| 42 | 55,714,286 | 10,833,333 | 5,342,466 | 2,653,061 | 1,056,911 | 659,898 |
| 43 | 56,571,429 | 10,702,703 | 5,351,351 | 2,675,676 | 1,067,385 | 666,667 |
| 44 | 57,428,571 | 10,864,865 | 5,432,432 | 2,697,987 | 1,077,748 | 673,367 |
| 45 | 58,285,714 | 11,027,027 | 5,440,000 | 2,720,000 | 1,088,000 | 680,000 |

Table 7 shows the relative power consumption per furnace run for different stack sizes. Table 7 also shows normalized power consumption for various anticipated yields for stack size ranging from 2 to 45. The power consumption shown in Table 7 is for producing 300 disks in a 5-year period. From Table 7, it can be observed that the amount of power needed to manufacture the crystals increases dramatically as the stack size increases.

TABLE 7

Power Consumption for 300 Good Crystals for Various Anticipated Yield Values

| Stack Size | Relative Power Consumption per Furnace Run | 1% | 5% | 10% | 20% | 50% | 80% |
|---|---|---|---|---|---|---|---|
| 2 | 1.0 | 0.029 | 0.026 | 0.024 | 0.023 | 0.023 | 0.023 |
| 3 | 3.0 | 0.081 | 0.048 | 0.046 | 0.046 | 0.045 | 0.046 |
| 4 | 6.0 | 0.076 | 0.067 | 0.068 | 0.068 | 0.068 | 0.068 |
| 5 | 10.0 | 0.120 | 0.090 | 0.092 | 0.092 | 0.091 | 0.091 |
| 6 | 15.0 | 0.113 | 0.119 | 0.117 | 0.115 | 0.114 | 0.114 |
| 7 | 21.0 | 0.150 | 0.140 | 0.138 | 0.138 | 0.137 | 0.137 |
| 8 | 28.0 | 0.190 | 0.158 | 0.160 | 0.160 | 0.160 | 0.159 |
| 9 | 36.0 | 0.174 | 0.184 | 0.182 | 0.182 | 0.182 | 0.182 |
| 10 | 45.0 | 0.208 | 0.209 | 0.207 | 0.205 | 0.205 | 0.205 |
| 11 | 55.0 | 0.243 | 0.233 | 0.231 | 0.229 | 0.228 | 0.227 |
| 12 | 66.0 | 0.279 | 0.256 | 0.254 | 0.252 | 0.250 | 0.250 |
| 13 | 78.0 | 0.316 | 0.279 | 0.277 | 0.274 | 0.273 | 0.273 |
| 14 | 91.0 | 0.284 | 0.300 | 0.298 | 0.295 | 0.296 | 0.295 |
| 15 | 105.0 | 0.315 | 0.320 | 0.319 | 0.319 | 0.319 | 0.319 |
| 16 | 120.0 | 0.347 | 0.340 | 0.345 | 0.341 | 0.341 | 0.341 |
| 17 | 136.0 | 0.380 | 0.359 | 0.363 | 0.363 | 0.363 | 0.363 |
| 18 | 153.0 | 0.413 | 0.390 | 0.388 | 0.388 | 0.387 | 0.386 |
| 19 | 171.0 | 0.447 | 0.407 | 0.413 | 0.409 | 0.410 | 0.409 |
| 20 | 190.0 | 0.481 | 0.438 | 0.436 | 0.433 | 0.432 | 0.432 |
| 21 | 210.0 | 0.429 | 0.454 | 0.460 | 0.456 | 0.455 | 0.455 |
| 22 | 231.0 | 0.458 | 0.484 | 0.483 | 0.479 | 0.478 | 0.478 |
| 23 | 253.0 | 0.487 | 0.498 | 0.505 | 0.501 | 0.500 | 0.500 |
| 24 | 276.0 | 0.517 | 0.529 | 0.527 | 0.523 | 0.524 | 0.523 |
| 25 | 300.0 | 0.546 | 0.541 | 0.549 | 0.549 | 0.545 | 0.546 |
| 26 | 325.0 | 0.576 | 0.571 | 0.570 | 0.570 | 0.568 | 0.569 |
| 27 | 351.0 | 0.606 | 0.601 | 0.599 | 0.595 | 0.592 | 0.591 |
| 28 | 378.0 | 0.636 | 0.611 | 0.620 | 0.615 | 0.614 | 0.614 |
| 29 | 406.0 | 0.667 | 0.641 | 0.640 | 0.640 | 0.638 | 0.636 |
| 30 | 435.0 | 0.697 | 0.650 | 0.659 | 0.659 | 0.659 | 0.659 |
| 31 | 465.0 | 0.728 | 0.679 | 0.688 | 0.683 | 0.682 | 0.682 |
| 32 | 496.0 | 0.758 | 0.707 | 0.707 | 0.707 | 0.705 | 0.704 |
| 33 | 528.0 | 0.789 | 0.736 | 0.735 | 0.730 | 0.727 | 0.728 |
| 34 | 561.0 | 0.703 | 0.743 | 0.753 | 0.753 | 0.751 | 0.751 |
| 35 | 595.0 | 0.730 | 0.771 | 0.782 | 0.776 | 0.773 | 0.772 |
| 36 | 630.0 | 0.757 | 0.800 | 0.799 | 0.799 | 0.797 | 0.795 |
| 37 | 666.0 | 0.783 | 0.828 | 0.827 | 0.822 | 0.818 | 0.819 |
| 38 | 703.0 | 0.810 | 0.833 | 0.844 | 0.844 | 0.842 | 0.841 |
| 39 | 741.0 | 0.837 | 0.860 | 0.872 | 0.866 | 0.865 | 0.863 |
| 40 | 780.0 | 0.864 | 0.888 | 0.888 | 0.888 | 0.888 | 0.886 |
| 41 | 820.0 | 0.891 | 0.916 | 0.916 | 0.909 | 0.911 | 0.909 |
| 42 | 861.0 | 0.918 | 0.944 | 0.943 | 0.937 | 0.933 | 0.932 |
| 43 | 903.0 | 0.945 | 0.945 | 0.958 | 0.958 | 0.956 | 0.955 |
| 44 | 946.0 | 0.973 | 0.973 | 0.986 | 0.979 | 0.978 | 0.978 |
| 45 | 990.0 | 1 | 1 | 1 | 1 | 1 | 1 |

Table 3 suggests that the higher the stack size the higher the output. However, output does not increase by much as the number of crystals produced per furnace run exceeds 20. Table 6 suggests that capital investment generally decreases as stack size increases. However, there are technological difficulties in building furnaces that can accommodate very tall stacks. Such technological difficulties include, but are not limited to, how to maintain vacuum in the furnace, how to maintain appropriate temperatures in the different thermal zones in the furnace, and how to design the crucibles to prevent leaks from hydrostatic forces. Therefore, it is important to minimize stack size while maximizing output. Table 7 suggests that power consumption increases significantly as stack size increases. Therefore, it is important to strike a balance between stack size and power consumption. In general, using a stake size in a range from 6 to 20 is productive because it provides a good balance between output and power consumption. The capital investment for this range is also minimal. Using a stack size in a range from 6 to 10 is also productive, and some of the technological difficulties associated with building very tall furnaces can be avoided.

Figure 7:
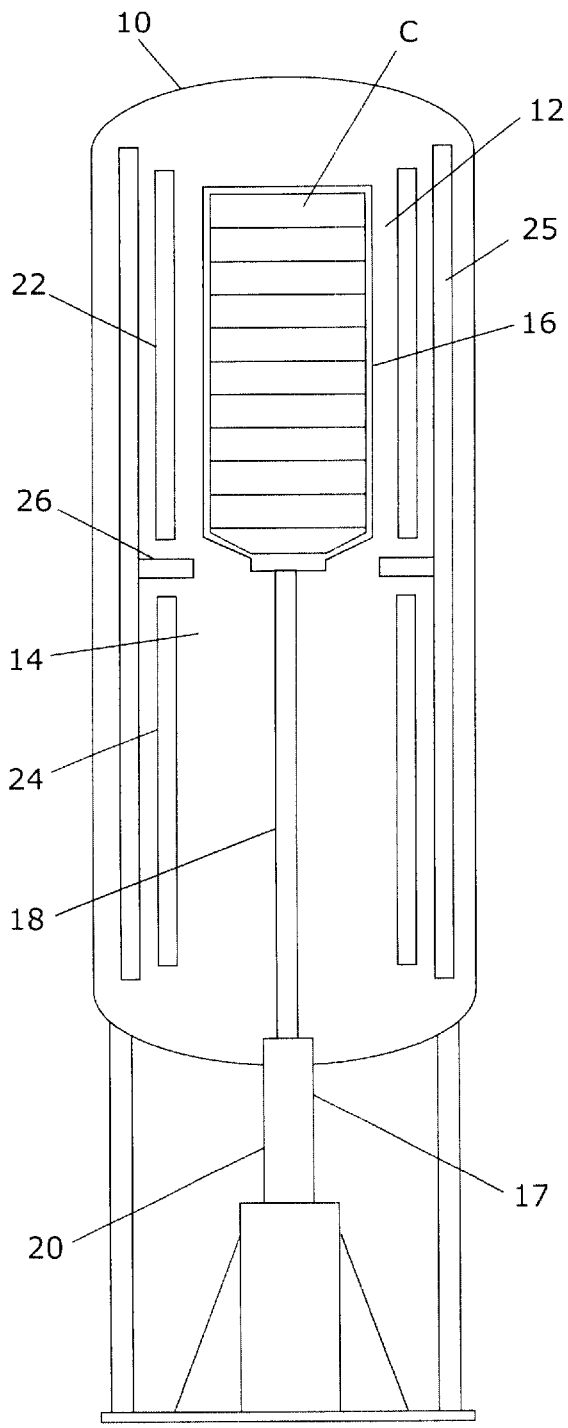
FIG. 7 shows a device for producing crystals according to an embodiment of the invention.
Figure 8:
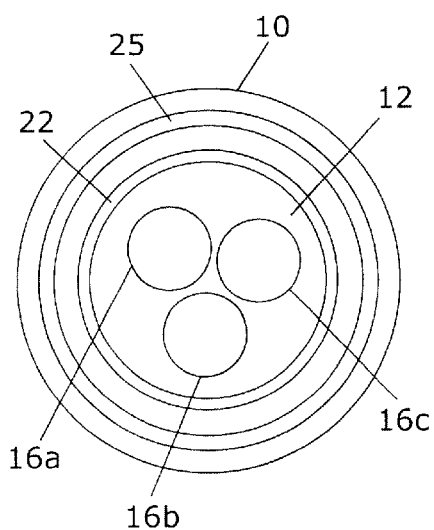
FIG. 8 shows multiple vertical stacks of crucibles arranged in a melting chamber of a furnace.

FIG. 7 shows a furnace 10 according to an embodiment of the invention. The furnace 10 includes a melting chamber 12 and an annealing chamber 14. Inside the melting chamber 12 is a stack of crucibles 16. In the illustration, the melting chamber 12 and annealing chamber 14 are built such that they can accommodate one or more vertically-stacked crucibles or crystal growth chambers. FIG. 8 shows a possible arrangement of multiple vertically-stacked crucibles 16a, 16b, 16c inside the melting chamber 12. The crucibles may have the same or different diameters. Returning to FIG. 7, the melting chamber 12 and annealing chamber 14 are built such that up to 10 crucibles can be stacked vertically inside them. In general, the melting and annealing chambers 12, 14 can be built to accommodate crucibles in a range from 6 to 20.

A lift mechanism 17 is coupled to the stack of crucibles 16 to lower the stack of crucibles 16 from the melting chamber 12 into the annealing chamber 14. For example, the lift mechanism 17 could be a rod 18 coupled to a hydraulic or pneumatic actuator 20. The actuator 20 may be controlled as necessary to translate the stack of crucibles 16 inside the furnace 10. The melting chamber 12 and the annealing chamber 14 have associated heating elements 22, 24 for maintaining an appropriate treatment temperature inside them. Insulating material 25 is provided around the heating elements 22, 24 to contain heat in the furnace 10. A temperature gradient between the melting chamber 12 and the annealing chamber 14 is obtained by a diaphragm 26 which partially isolates the melting chamber 12 from the annealing chamber 14. It should be noted that the heating element 24 in the annealing chamber 14 is optional. Also, the heating element 24 does not have to extend across the entire length of the annealing chamber 14, i.e., a short heater can be used in the annealing chamber 14, just below the diaphragm 26.

Figure 9A:
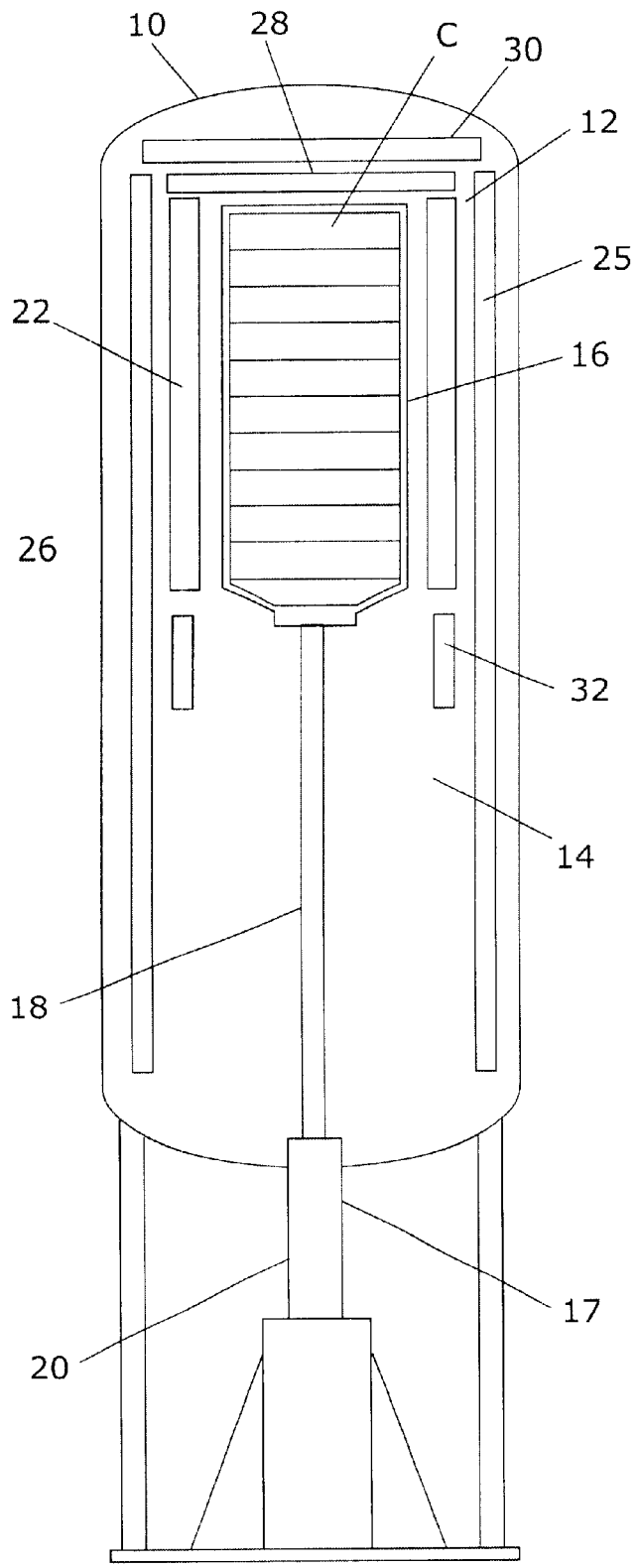
FIGS. 9A–9C show alternate furnace configurations.
Figure 9B:
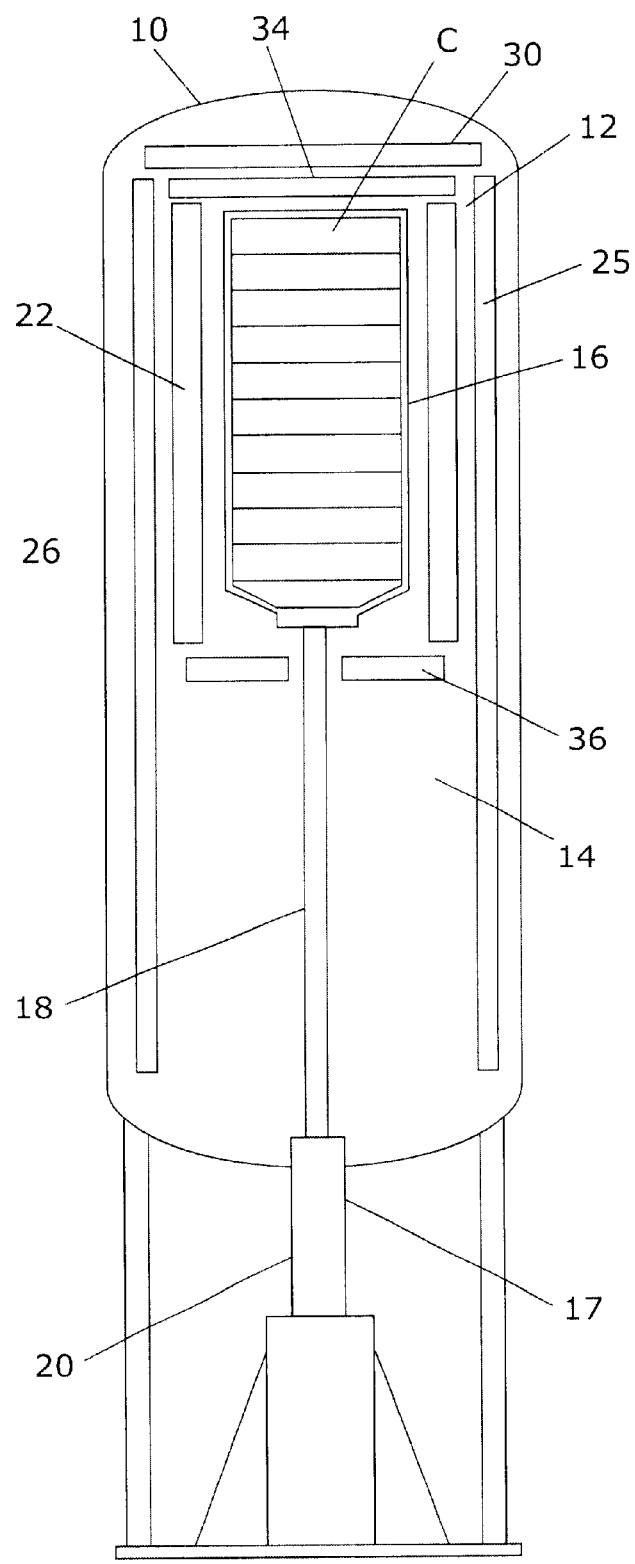
Figure 9C:
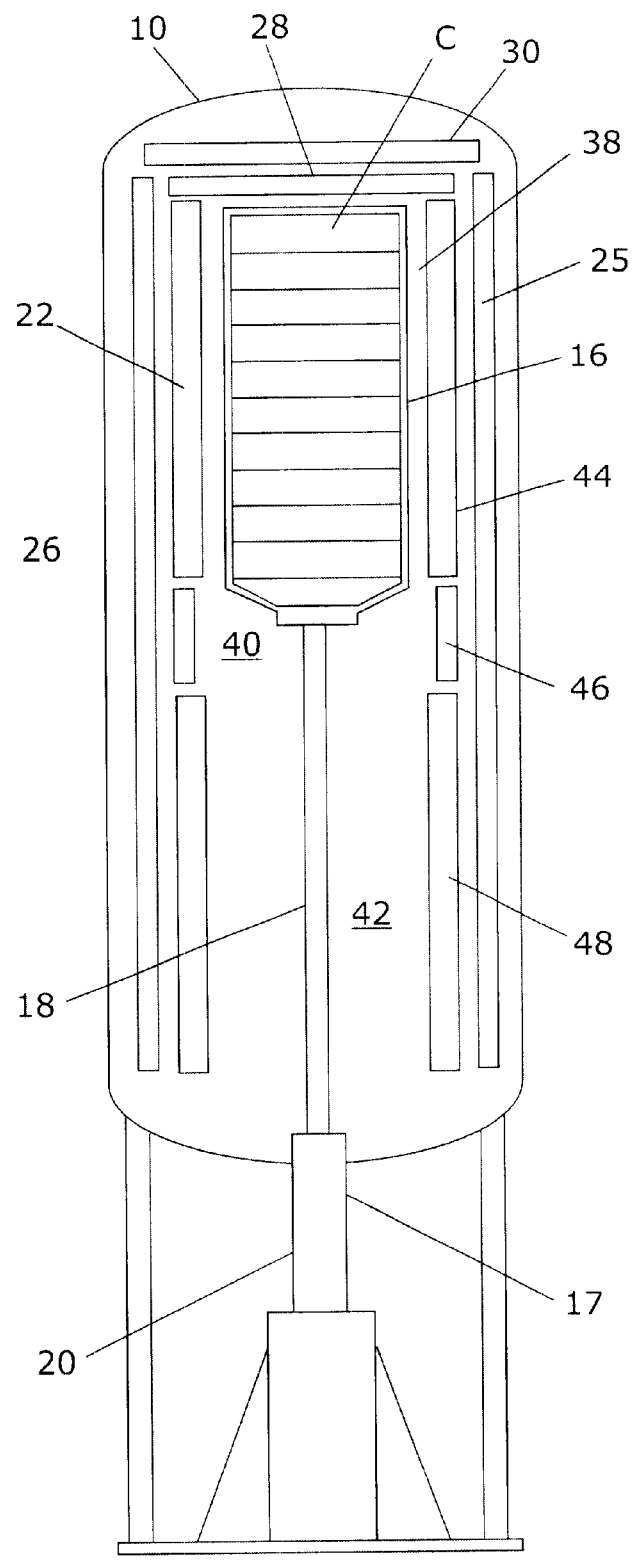

Alternate configurations of the furnace 10 are possible. FIG. 9A shows an alternate arrangement wherein a heater 28 is provided above the stack of crucibles 16. Above the heater 28 is an insulating material 30. The heater 32 in the annealing chamber 14 is a short heater and does not extend across the entire length of the annealing chamber 14. FIG. 9B shows another arrangement wherein heaters 34, 36 are positioned at the top and bottom of the stack 16, respectively. The purpose of the heaters 34, 36 at the top and bottom of the stack (also heater 28 in FIG. 9A) is to provide uniform temperature distribution across the stack 16. This has the effect of reducing thermally-induced stresses in the crystals, which would otherwise result in high birefringence values. FIG. 9C shows a furnace configuration having three thermal zones 38, 40, 42. Heaters 44, 46, 48 are positioned in the three zones 38, 40, 42, respectively, to provide the appropriate treatment temperatures. This furnace configuration may be used to grow crystals using the previously described Traveling Heater technique. In general, the size of the furnaces can be selected such that they can accommodate one or more vertical stacks of crystal growth chambers or crucibles, where the number of crystal growth chambers in each stack may be in a range from 6 to 20.

Returning to FIG. 7, the furnace 10 is hermetically sealed and the required atmosphere is created inside the melting chamber 12, i.e., vacuum, inert, or fluorinating environment. Each crucible C in the stack 16 contains a crystal raw material. The melting chamber 12 is heated to a temperature sufficient to melt the crystal raw material or maintain the crystal raw material in a molten state. The crucibles C with the molten material are slowly translated from the melting chamber 12 to the annealing chamber 14, which is maintained at a temperature lower than the temperature in the melting chamber 12. The crystal forms in the molten material as the molten material is translated through the temperature gradient. The length of time required to solidify the molten material depends on the stack height. The higher the stack, the longer it takes to translate the stack of crucibles from the melting chamber to the annealing chamber. The time required to cool the crystals is generally independent of the stack height.

The invention provides one or more advantages. The invention provides an optimum range of crystal growth chambers to stack together vertically in order to achieve a high production efficiency in a crystal growth batch process. The high production efficiency is achieved while maximizing output and minimizing production cost. Multiple vertical stacks of crystal growth chambers can be used in a single furnace run to further increase the output of the furnace without affecting production efficiency. The verticle stacks of the inventive methods have at least six crystal growth chambers, preferably at least seven crystal growth chambers, and more preferably at least eight crystal growth chambers. In preferred embodiments, the methods of the invention utilize verticle stacks with six to eleven crystal growth chambers, six to ten crystal growth chambers, seven to eleven crystal growth chambers, and seven to ten crystal growth chambers. In preferred embodiments, the methods of the invention utilize fluidly interconnected crystal growth chambers to provide for crystal growth orientation transfer from one growth chamber to the next, preferably with the crystal growth orientation being a seeded crystal growth orientation with crystal orientation initiated with a seed crystal of the desired orientation such as 111 or 001.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A batch method for producing a batch of below 200 nm transmitting element preform optical fluoride crystals for formation into optical elements with below 200 nm transmission, comprising:

loading a fluoride raw material into a vertical stack batch having at least 6 crystal growth chambers;

loading the vertical stack batch into a crystal growing batch furnace;

heating the vertical stack batch to a temperature sufficient to maintain the fluoride raw material in a molten condition in the batch furnace;

applying a crystal growth thermal gradient to the vertical stack batch to grow a batch of crystals from the molten fluoride raw material inside said crystal growth chambers in the batch furnace; and cooling the batch furnace and the batch of grown crystals and then unloading the batch of grown crystals from the furnace to provide below 200 nm transmitting optical element preform fluoride crystals.

2. The batch method of claim 1, wherein heating the vertical stack batch comprises positioning the vertical stack batch in a first zone of the batch furnace and heating the first zone of the batch furnace to the temperature sufficient to maintain the fluoride raw material in the molten condition.

3. The method of claim 2, wherein applying the crystal growth thermal gradient to the vertical stack batch to form crystals comprises translating the vertical stack batch from the first zone of the batch furnace to a second zone of the batch furnace that is maintained at a temperature lower than the temperature of the first zone of the batch furnace.

4. The method of claim 1, wherein translating the vertical stack batch comprises translating the vertical stack batch at a speed of 0.5 mm/hr to 5 mm/hr.

5. The method of claim 1, wherein cooling the crystals and the batch furnace comprises slowly cooling the crystals and the batch furnace to ambient temperature for 2 to 30 days.

6. The method of claim 1, wherein a diameter of the crystals of the batch ranges from 10 to 300 mm.

7. The method of claim 1, wherein a thickness of the crystals of the batch ranges from 40 to 400 mm.

8. The method of claim 1, wherein a refractive index of at least one of the crystals of the batch varies by less than 4 ppm across a flat surface of the crystal when measured using a 632-nm laser.

9. The method of claim 1, wherein an average birefringence of at least one of the crystals of the batch is less than 4 nm/cm when measuring using a 632-nm laser.

10. The method of claim 1, wherein an initial internal transmission of at least one of the crystals of the batch is greater than 99% at wavelengths greater than 155 nm and greater than 75% at wavelengths between 135 nm and 155 nm.

11. The method of claim 1, wherein applying the thermal gradient to the vertical stack batch to form crystals comprises decreasing the temperature of the vertical stack batch in a manner that allows a thermal gradient to be sustained within the crystal growth chambers.

12. The method of claim 1, wherein the crystal growth chambers in the vertical stack batch range from 6 to 10.

13. The method of claim 1, wherein the crystal growth chambers in the vertical stack batch range from 6 to 20.

14. A batch method for producing a batch of optical fluoride crystals, comprising:
loading a fluoride raw material into a batch of multiple vertical stacks of crystal growth chambers, wherein at least one vertical stack has at least 6 crystal growth chambers;
loading the batch into a crystal growing batch furnace,
heating the batch of vertical stacks in the batch furnace to a temperature sufficient to maintain the fluoride raw material in a molten condition;
applying a thermal gradient to the batch of vertical stacks to form crystals within the molten fluoride raw material; and
cooling the batch furnace and the crystals, and unloading the crystals from the batch furnace.

15. The method of claim 14, wherein heating the vertical stacks comprises positioning the vertical stacks in a first zone of the batch furnace and heating the first zone of the furnace to the temperature sufficient to maintain the fluoride raw material in the molten condition.

16. The method of claim 15, wherein applying the thermal gradient to the vertical stacks to form crystals comprises translating the vertical stacks from the first zone of the furnace to a second zone of the furnace that is maintained at a temperature lower than the temperature of the first zone of the furnace.

17. The method of claim 14, wherein translating the vertical stacks comprises translating the vertical stacks at a speed of 0.5 mm/hr to 5 mm/hr.

18. The method of claim 14, wherein cooling the batch furnace and the crystals comprises slowly cooling the batch furnace and the crystals to ambient temperature for 2 to 30 days.

19. The method of claim 14, wherein applying the thermal gradient to the vertical stacks to form crystals comprises decreasing the temperature of the vertical stacks in a manner that allows a thermal gradient to be sustained within the crystal growth chambers.

20. The method of claim 14, wherein the crystal growth chambers in the vertical stacks range from 6 to 10.

21. The method of claim 14, wherein the crystal growth chambers in the vertical stacks range from 6 to 20.

22. An optical fluoride crystal batch furnace for growing a batch of optical fluoride crystals, comprising:
a batch furnace having a capacity to hold a vertical stack batch of 6 to 10 optical fluoride crystal growth chambers for growth of optical fluoride crystals having a diameter of 40 to 400 mm and a thickness of 10 to 300 mm, the batch furnace containing the vertical stack batch of 6 to 10 optical fluoride crystal growth chambers, the batch furnace having a first zone with a first heating element and a second zone with a second heating element and a lift mechanism rod and an actuator which translates the batch of 6 to 10 growth chambers from the first zone to the second zone to grow the batch of 6 to 10 optical fluoride crystals with the first zone and the second zone cooled to ambient temperature before the unloading of the batch of 6 to 10 optical fluoride crystals from the batch furnace.

23. The device of claim 22, further comprising a third heating element positioned at a top end of the first zone.

24. The device of claim 23, further comprising a third heating element positioned at a bottom end of the first zone.

* * * * *